(12) United States Patent
Fathololoumi et al.

(10) Patent No.: US 9,705,278 B2
(45) Date of Patent: Jul. 11, 2017

(54) RESOLUTION OF MODE HOPPING IN THE OUTPUT OF LASER CAVITIES

(71) Applicant: Kotura, Inc., Monterey Park, CA (US)

(72) Inventors: Saeed Fathololoumi, San Gabriel, CA (US); Dazeng Feng, El Monte, CA (US); Amir Ali Tavallaee, Los Angeles, CA (US); Jacob Levy, Sierre Madre, CA (US); Pegah Seddighian, Pasadena, CA (US); Mehdi Asghari, Pasadena, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 30 days.

(21) Appl. No.: 14/869,002

(22) Filed: Sep. 29, 2015

(65) Prior Publication Data

US 2017/0093114 A1    Mar. 30, 2017

(51) Int. Cl.
| | |
|---|---|
| *H01S 3/10* | (2006.01) |
| *H01S 3/09* | (2006.01) |
| *H01S 3/102* | (2006.01) |
| *H01S 5/026* | (2006.01) |

(52) U.S. Cl.
CPC .......... *H01S 3/10053* (2013.01); *H01S 3/09* (2013.01); *H01S 3/1028* (2013.01); *H01S 5/026* (2013.01)

(58) Field of Classification Search
CPC .... H01S 3/10053; H01S 5/026; H01S 3/1028; H01S 3/09
See application file for complete search history.

(56) References Cited

U.S. PATENT DOCUMENTS

| | | |
|---|---|---|
| 6,868,100 B2 | 3/2005 | Larson et al. |
| 8,582,109 B1 | 11/2013 | Schmitt |
| 2003/0026302 A1 | 2/2003 | Anthon et al. |
| 2003/0035449 A1* | 2/2003 | Tomlinson ............ H01S 5/0687 372/29.02 |
| 2004/0213306 A1 | 10/2004 | Fennema et al. |
| 2005/0281298 A1* | 12/2005 | Kupershmidt .......... H01S 5/141 372/34 |

(Continued)

OTHER PUBLICATIONS

Copenheaver, Blaine R., International Search Report and Written Opinion, PCT/US2016/048929, United States Patent and Trademark Office, Nov. 3, 2016.

*Primary Examiner* — Yuanda Zhang
(74) *Attorney, Agent, or Firm* — Gavrilovich, Dodd & Lindsey, LLP

(57) ABSTRACT

An optical system includes a laser cavity on a base. The laser cavity generates a light signal in response to application of an electrical current to the laser cavity. The system includes first electronics that apply a target level of the electrical current to the laser cavity so as to cause the laser cavity to generate the light signal. The light signal experiences mode hops at electrical current levels that shift to higher current levels in response to increasing laser operation times. A first one of the mode hops occurs at a first current level and a second one of the mode hops occurs at a second current level that is higher than the first current level. The system also includes a phase shifter that interacts with the laser cavity so as to shift the mode hops to lower current levels than occur in the absence of the phase shifter.

19 Claims, 17 Drawing Sheets

(56) References Cited

U.S. PATENT DOCUMENTS

| | | | |
|---|---|---|---|
| 2006/0002443 A1* | 1/2006 | Farber | H01S 5/141 |
| | | | 372/50.1 |
| 2007/0263676 A1* | 11/2007 | Beukema | H01S 3/09415 |
| | | | 372/6 |
| 2008/0089370 A1 | 4/2008 | Bhatia et al. | |
| 2008/0159341 A1 | 7/2008 | Patel et al. | |
| 2010/0074089 A1 | 3/2010 | Smith et al. | |
| 2014/0105239 A1* | 4/2014 | Asghari | H01S 5/141 |
| | | | 372/99 |

\* cited by examiner

RESOLUTION OF MODE HOPPING IN THE OUTPUT OF LASER CAVITIES

FIELD

The present invention relates to optical systems and more particularly to optical devices having a laser cavity.

BACKGROUND

Lasers are commonly used as the source of light signals in optical communications systems. These lasers are often integrated onto optical chips and/or onto optoelectronic chips. The laser cavities in these lasers can be external cavity lasers configured to output a light signal with a single wavelength or a single longitudinal cavity mode. One of the challenges with these lasers is mode hopping. Mode hopping refers to shift in output light wavelength when laser switches from one longitudinal mode to another. The change between modes is associated with an undesirable discrete change in the wavelength (and sometimes power) of the light signal output by the laser. These changes are a source of bit error in optical links.

The mode hopping can be a result of influences that change the index of refraction of the media through which the light signals are guided in the laser cavity. Examples of influences that can cause these effects are temperature changes, changes in the level of electrical current applied to the laser cavity, or aging of the gain medium. In order to address these problems, many of these devices include components for stabilizing the indices of refraction of the media through which the light signals are guided. These components increase the complexity, cost, and power consumption of the device.

SUMMARY

A method of operating an optical system can be performed with a laser cavity that generates a light signal in response to application of an electrical current to the laser cavity. The method includes applying a target level of the electrical current to the laser cavity so as to cause the laser cavity to generate the light signal. The laser cavity is constructed such that the light signal experiences mode hops at electrical current levels that shift to higher current levels in response to increasing the time of operation of the laser cavity. A first one of the mode hops occurs at a first current level and a second one of the mode hops occurs at a second current level that is higher than the first current level. The method also includes shifting the mode hops to electrical current levels where the target current level is between the first current level and the second current level and such that a difference between the target level and the first current level is more than 20% or 40% of a difference between the second current level and the first current level.

An optical system includes a laser cavity on a base. The laser cavity generates a light signal in response to application of an electrical current to the laser cavity. The system includes first electronics that apply a target level of the electrical current to the laser cavity so as to cause the laser cavity to generate the light signal. The light signal experiences mode hops at electrical current levels that shift to higher current levels in response to increasing laser operation times. A first one of the mode hops occurs at a first current level and a second one of the mode hops occurs at a second current level that is higher than the first current level. The system also includes a phase shifter that changes the effective length of the laser cavity. Increasing the effective length of the laser cavity length shifts the mode hops to lower current levels. The system also includes second electronics that operate the phase shifter so as to shift the mode hops to electrical current levels where the target current level is between the first current level and the second current level, and such that a difference between the target level and the first current level is more than 20% or 40% of a difference between the second current level and the first current level. In some instances, the phase shifter is a heater.

BRIEF DESCRIPTION OF THE FIGURES

FIG. 4A is a topview of the multi-channel device.

FIG. 4B is a cross section of the cavity waveguide shown in FIG. 4A taken along the line labeled B.

FIG. 4C is a cross section of the multi-channel device shown in FIG. 4A taken along a line extending between the brackets labeled C in FIG. 4A.

FIG. 4D is a cross section of the multi-channel device shown in FIG. 4A taken along a line extending between the brackets labeled D in FIG. 4A.

DESCRIPTION

Laser cavities often generate a light signal in response to an application of electrical current to the laser cavity. The light signal output by the laser cavity often mode hops at different levels of applied electrical current depending on the effective cavity length. The inventors have found that the current levels of the mode hops increase as the time of operation of the laser cavity increases. In other words, the current level at which a mode hop occurs increases as the laser cavity ages. The inventors have also developed techniques for shifting the mode hops to lower current levels. For instance, the inventors have found that the mode hops can be shifted to lower current levels by using a phase shifter to increase the effective cavity length of the laser. This feature is used to overcome the time-based shift of the mode hops to higher current levels. For instance, it is generally desirable to operate a laser cavity at a target electrical current so the laser cavity generates light signals of a target power level. The target current is generally between the current level for a first mode hop and the current level of a second mode hop with the second current level being higher than the first current level. As the laser cavity's operational time increases, the first mode hop shifts to higher current levels and will eventually reach the target current. At this time, the laser cavity will experience a mode hop. However, a phase shifter can be used to shift the mode hops to lower current levels and can accordingly shift the first mode hop away from the target current. As a result, the amount of time that passes before the first mode hop shifts to the target current is delayed.

In some instances, the use of the phase shifter does not require the use of additional feedback loops that adjust the phase shifter in response to characteristics of the light signal. For instance, the laser cavity can exclude electronics that change operation of the hop adjuster in response to the changes in the intensity and/or wavelength of the light signal output from the laser cavity or in response to a high Bit Error Rate (BER) in the transmission system. As an example, the phase shifter can be a heater configured to maintain the effective cavity length of the laser cavity at a particular length. The absence of these feedback mechanisms reduces the complexity and cost of the system. Accordingly, the system can avoid longitudinal mode hops without substantially adding to costs and/or complexity.

Figure 1:
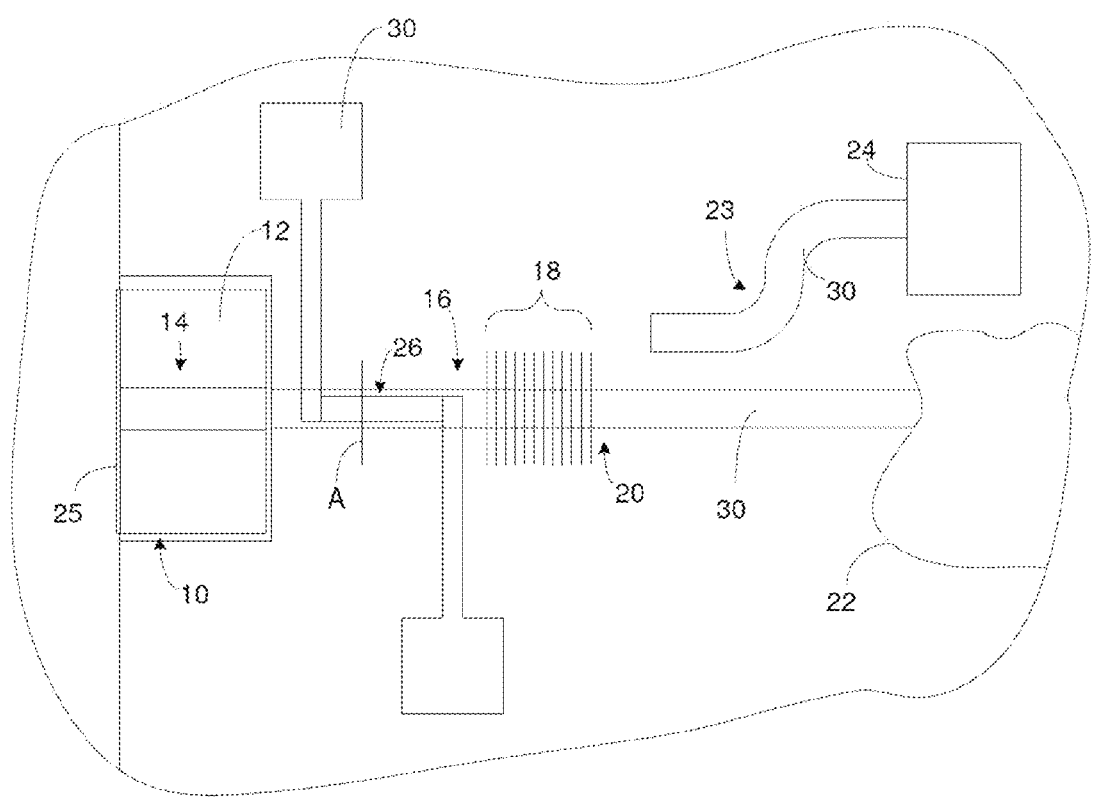
FIG. 1 is a topview of an optical device that includes a laser cavity.

FIG. 1 is a topview of an optical device having a laser cavity that includes a gain element 10. While certain features of the gain element 10 are not shown in FIG. 1, the gain element 10 includes a gain medium 12 that is shown in FIG. 1. A gain waveguide 14 is defined in the gain medium 12. A cavity waveguide 16 provide an optical pathway from the gain waveguide 14 to a partial return device 18. An output waveguide 20 provides an optical pathway from the partial return device 18 to optical components 22 included on the device. The optical components 22 are optional and, in some instances, the output waveguide 20 terminates at a facet located centrally on the device or at an edge of the device so the device can be connected to an optical fiber. Examples of suitable optical components 22 include, but are not limited to, optical splitters, demultiplexers, multiplexers, filters, switches, amplifiers, star couplers, optical fibers, circulators, optical attenuators, modulators, etc. One, two, or three waveguides selected from the group consisting of the gain waveguide 14, cavity waveguide 16, and the output waveguide 20 can be a single transverse mode waveguide (single mode waveguide) or multiple transverse mode waveguide (multimode waveguide).

A coupled waveguide 23 may optionally be optically coupled with the output waveguide 20 such that a portion of the output light signal is coupled into the coupled waveguide 23. The coupled waveguide 23 guides the tapped portion of the output light signal to a light sensor 24. The light sensor 24 is configured to convert the received light signal to an electrical signal. Electronics (not shown) can be in electrical communication with the light sensor 24 and can receive the electrical signal from the light sensor 24. In some instances, the electronics are also in electrical communication with the gain element 10. For instance, the electronics can apply electrical energy to the gain element 10.

During operation of the device, the cavity waveguide 16 carries a laser light signal from the gain medium 12 to the partial return device 18. The partial return device 18 returns a first portion of the laser light signal along its original path and permits a second portion of the laser light signal to enter the output waveguide 20. As a result, the second portion of the laser light signal serves as the light signal output by the laser.

The cavity waveguide 16 carries the first portion of the laser light signal back to the gain waveguide 14. The gain waveguide 14 guides the received first portion of the laser light signal through the gain medium 12 to a reflector 25. The reflector 25 reflects the laser light signal portion such that the first laser light signal portion returns to the gain waveguide 14 and eventually to the partial return device 18. Accordingly, the first laser light signal portion travels through the gain waveguide 14 twice before returning to the partial return device 18. The gain medium 12 in combination with the multiple passes of the laser light signal through the gain medium 12 are the source of optical gain in the laser. Energy can be applied to the gain medium 12 to provide the optical gain. In some instances, the energy is an electrical current driven through the gain medium by the electronics but other forms of energy can be used. The reflector 25 can be highly reflective so substantially all of the first laser light signal portion that is incident on the reflector 25 is returned to the gain waveguide 14.

During the generation of the output light signal, the electronics receive the electrical signal from the light sensor 24. The electronics can also adjust the level of electrical energy applied to the gain element 10 in response to the electrical signal received from the light sensor 24 in a feedback loop. For instance, in the event that the electrical signal from the light sensor 24 indicates that the intensity of the output light signal is above a threshold, the electronics can reduce the electrical energy applied to the gain medium 12 in order to reduce the intensity of the output light signal.

The device includes one or more phase shifters that interact with the laser cavity and/or are included in the laser cavity such that operation of the one or more phase shifters that changes the effective optical path length ('effective length') of the laser cavity by changing the refractive index in at least a region of the cavity. An example of a suitable phase shifter includes, consists of, or consists essentially of a temperature control device. Accordingly, the device can include one or more temperature control devices positioned so as to change the effective length of the laser cavity. Suitable temperature control devices can each provide cooling and/or heating of all or a portion the laser cavity. A suitable temperature control device can be a heater such as a micro-heater.

An example of a temperature control device that can act as a phase shifter is a resistive heater. FIG. 1 illustrates a resistive heater 26 positioned on the ridge of the cavity waveguide 16. Electrical conductors 27 provide electrical communication between contact pads 28 and the heater 26. The electronics can be connected to the contact pads 26 and can drive an electrical current between the contacts pads such that the electrical current passes through the heater 26.

The heater can be constructed of different materials and/or have different dimensions so heat is generated by the heater 26 without being substantially generated by the conductors 27. The device can optionally include one or more temperature sensors positioned so as to sense the temperature of all or a portion of the laser cavity.

When a phase change occurs at one or more regions in the laser cavity, the phase change at the one or more regions causes a change to the effective length of the laser cavity. Accordingly, when a heater is employed as a phase shifter, the heater can be positioned and/or operated such that thermal energy from the heater is applied to a region of the laser cavity rather than to the entire laser cavity. For instance, the heater can be a localized heater that creates a temperature change that is localized to a region of the laser cavity. In general, increasing the temperature of a region of the laser cavity increases the level of an induced phase change.

Figure 2A:
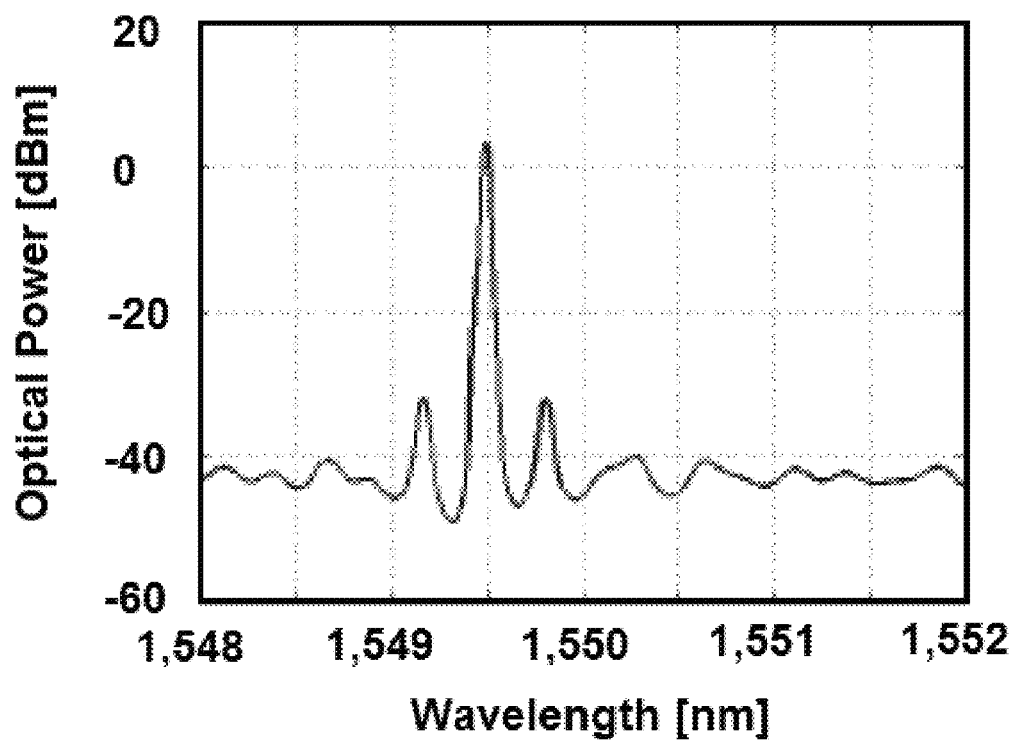
FIG. 2A shows the output profile for an optical device having a first laser cavity constructed according to FIG. 1. The output profile shows the optical power output by the laser as a function of wavelength.

FIG. 2A presents an output profile for an optical device having a first laser cavity constructed according to FIG. 1. The output profile shows the optical power output from the laser cavity as a function of wavelength. The output includes light in multiple different longitudinal modes. The mode with the most intense wavelength output by the laser cavity is shown at a wavelength of about 1549.50 nm with an intensity (or power) of about 3.34 dBm. The second most intense mode is shown at a wavelength of about 1549.20 nm and has an intensity (or power) of about −31.79 dBm. When the laser cavity experiences a mode hop, a different one of the modes becomes the most intensely output mode.

Figure 2B:
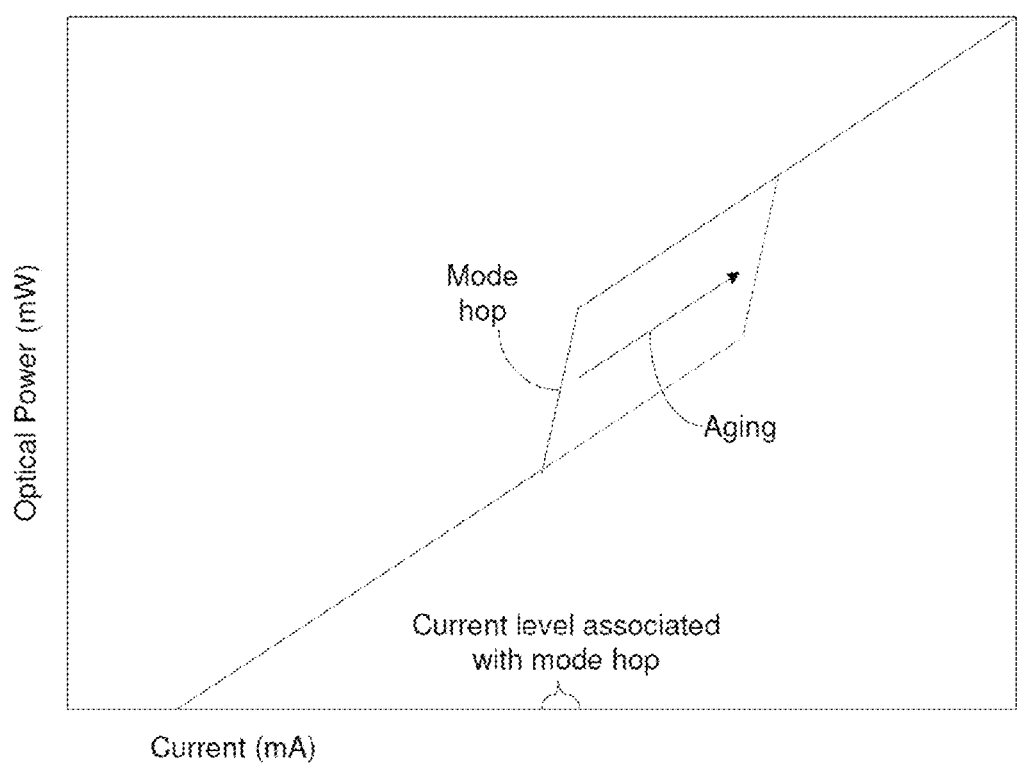
FIG. 2B is a power versus current graph showing the shifting of mode hops in response to aging of a gain medium.

Mode hops can have several sources. For instance, mode hoping can be a result of changes in the temperature of the laser cavity, changes in the electrical current applied to the laser cavity, or aging of the gain medium. FIG. 2B illustrates mode hopping as a result of changes to the current level applied to the laser. For instance, the solid line in FIG. 2B shows the optical power output by the laser cavity during operation of the laser cavity as a function of bias current applied to the gain medium. As the applied current increases, the optical power increases but once a current level is reached the power of the light signal shows a sudden increase. This increase is a result of the laser cavity hopping between modes illustrated in FIG. 2A. Depending on the nature of the mode hop, the current level associated with a mode hop can be a single current amount or a range of currents as shown in FIG. 2B.

The inventors have found that as the gain medium of a laser ages in response to use, the current level of the mode hops increases. This increase in the current level is illustrated by arrow labeled "aging" in FIG. 2B and results in the power versus current curve shown by the dashed line in FIG. 2B.

Figure 2C:
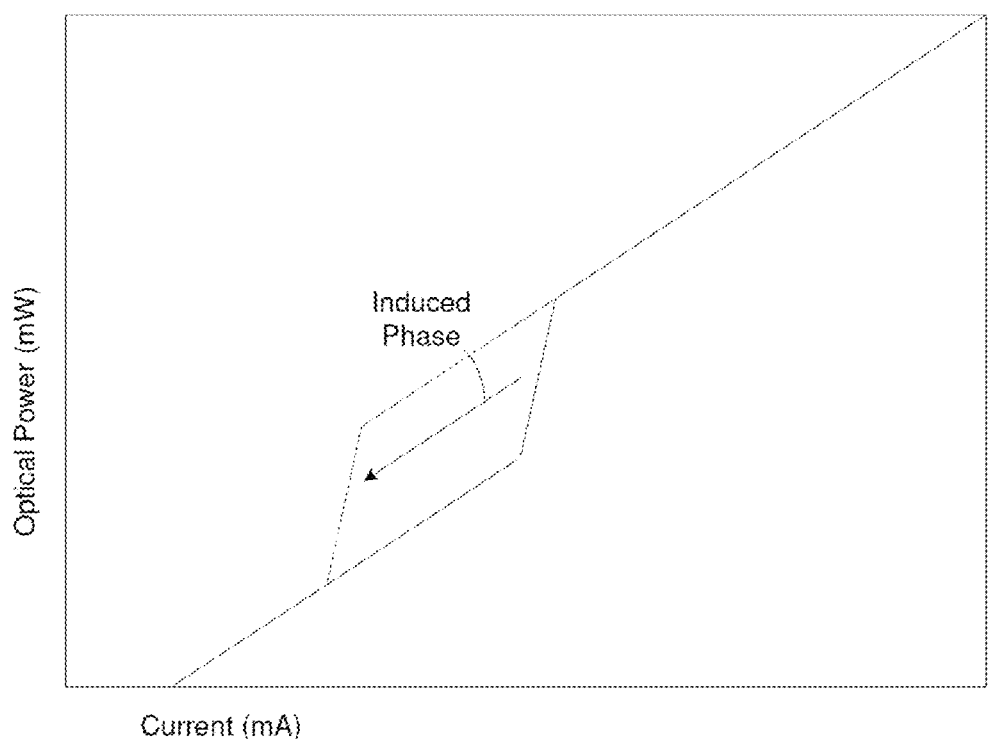
FIG. 2C is a power versus current graph showing the shifting of mode hops in response to changes in electrical power applied to a phase shifter.

The inventors have also found that as the effective cavity length of the laser increases, the current level of a mode hop decreases. This decrease in the current level is illustrated by arrow labeled "induced phase" in FIG. 2C and results in the power versus current curve shown by the dashed line in FIG. 2C. The shifting of the mode hop current levels due to phase changes is reversible while the shifting of the mode hop current levels due to aging of the gain medium is irreversible or substantially irreversible.

Figure 2D:
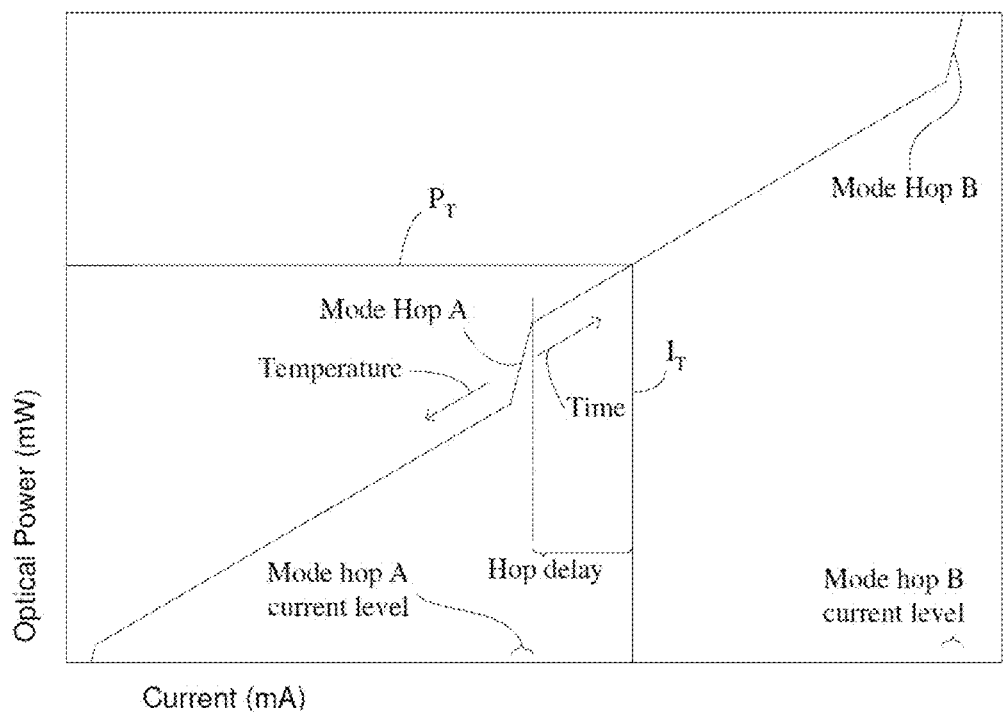
FIG. 2D is a power versus current graph for a laser cavity operated at a target current level.

The change to the current level of a mode hop in response to a phase shifter such as the heater 26 of FIG. 1 can be employed to delay the mode hopping that occurs as a result of an aging gain medium. For instance, FIG. 2D illustrates a power versus current curve showing two different mode hops. The components on a device generally require that the laser cavity produce a light signal with a particular optical power or range of optical powers. As a result, the laser cavity is generally operated so as to generate a target optical power labeled PT in FIG. 2D. In order to generate the target optical power, the electronics apply a target current level labeled IT in FIG. 2D. The target optical power and target current level are positioned between the mode hops labeled "mode hop A" and "mode hop B" in FIG. 2D. These mode hops will respond to phase induction and time as discussed in the context of FIG. 2B and FIG. 2C. As is evident from the arrows in FIG. 2D, when phase is held constant and the laser ages, mode hop A will eventually reach the target current level and a mode hop will occur.

Figure 2E:
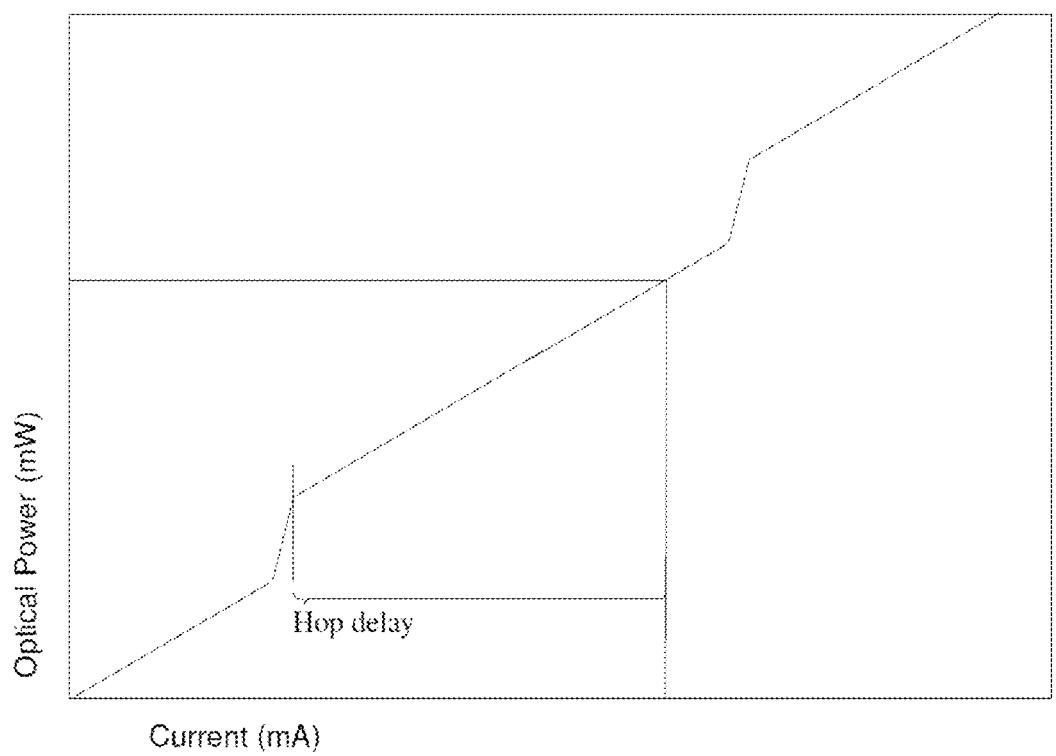
FIG. 2E is a power versus current graph for a laser cavity operated at a target current level after a phase shifter is employed to shift mode hops in FIG. 2D to lower current levels.

The phase shifter can be used to delay mode hop A from reaching the target current level. For instance, FIG. 2E illustrates the curve (Power versus Current) from FIG. 2D after the electronics use the phase shifter to increase the effective cavity length of the laser. The target optical power (PT) and the target current level (IT) are both at the same level in FIG. 2D and FIG. 2E. In FIG. 2E, mode hop A and mode hop B are both shifted to lower current levels relative to the same mode hops in FIG. 2D. The movement of these mode hops to lower current levels moves mode hop B toward the target current level (IT) and moves mode hop A away from the target current level (IT).

The difference in current between the target current level (IT) and the current level of mode hop A indicates the amount of life that the device has before experiencing a mode hop. Accordingly, this variable is labeled the "hop delay" in FIG. 2D and FIG. 2E. The hop delay indicates the amount of pre-hop lifetime that remains in the device because it is the amount of current over which the mode hops must shift in response to aging of the gain medium in order to reach the target current level. FIG. 2E shows a larger hop delay than FIG. 2D because the phase shift induced by the phase shifter caused mode hop A to shift away from the target current level (IT) and accordingly increased the mode hop delay. Accordingly, the phase shifter can be operated so as to increase the mode hop delay. For instance, when a heater is used as a phase shifter, the temperature of all or a portion of the laser cavity can be controlled so as to increase the mode hop delay.

Figure 2F:
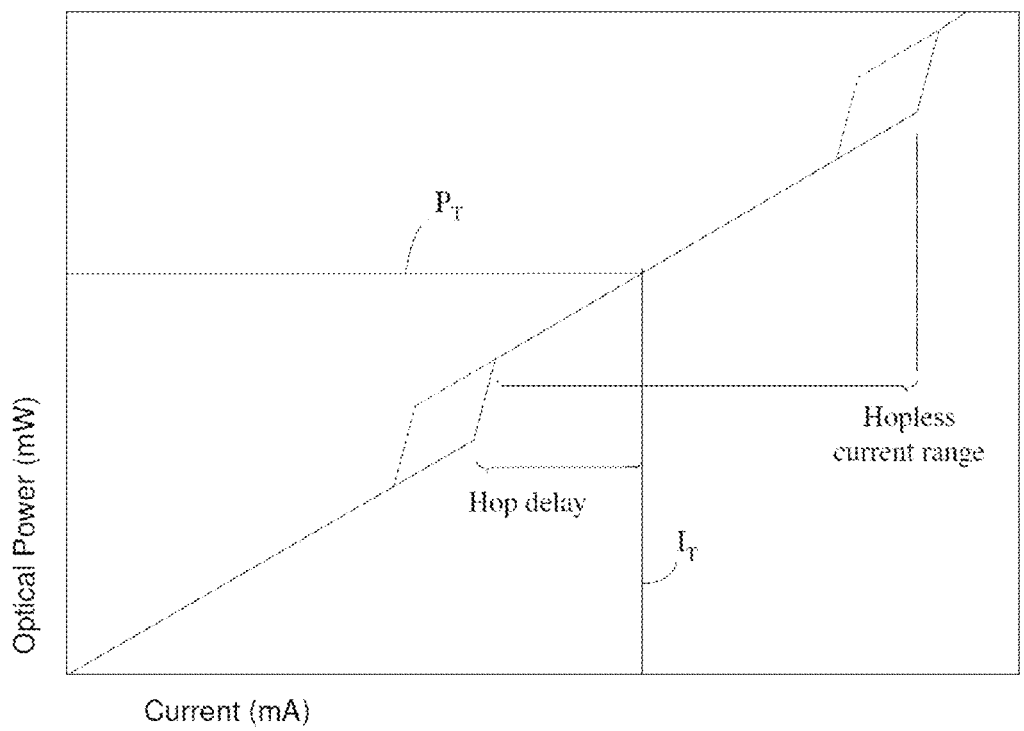
FIG. 2F illustrates the power versus current curve for a laser cavity after fabrication but before operation of the laser cavity and before operation of a phase shifter.

The ability to control the mode hop delay is used to extend the life that the laser cavity can provide without experiencing mode hops. FIG. 2F illustrates the power versus current curve for a laser cavity after fabrication, before operation of the phase shifter, and before operating the laser cavity so as to generate a light signal. The dashed lines illustrate the curve before the "burn-in" of the laser cavity. Burn-in is a phase of laser cavity fabrication designed to increase stability and/or reliability of the laser by exposing the laser cavity to high levels of applied current. The burn in is generally performed at elevated temperatures. For instance, the burn-in can be performed at temperatures of about 100 C, using current levels of 150 mA, for a time period of 72 hours. This procedure can increase the stability of the laser cavities with respect to output power. As illustrated in FIG. 2F, the burn-in of the laser cavity can shift the mode hops to higher current levels.

The target optical power (PT) and the target current level (IT) at which it is desirable to operate the laser cavity are labeled in FIG. 2F. The hop delay before the passage of time causes "mode hop A" to shift to the target current level may be undesirably short. For instance, the total possible current range that can be used to power the laser before a mode hop occurs is the amount of current between the hops that the target current is located between. As an example, the total possible current range that can be used without a mode hop extends from the "mode hop A current level" to "mode hop B current level" and is labeled "hopless current range" in FIG. 2F. In some instances, the hopless current range is greater than 10, 20, or 30 mA and/or less than 40, 50, or 60 mA. Since FIG. 2F is after laser fabrication, without operation of the phase shifter, and operating the laser cavity so as to generate a light signal, the illustrated hop delay is the pre-shift hop delay. In many instances, the pre-shift hop delay is less than 10%, 30%, or 50% of the "hopless current range." In FIG. 2F, the "hop delay" does not make use of a substantial portion of the "hopless current range" before mode hop A shifts to the target current level and a mode hop occurs.

Figure 2G:
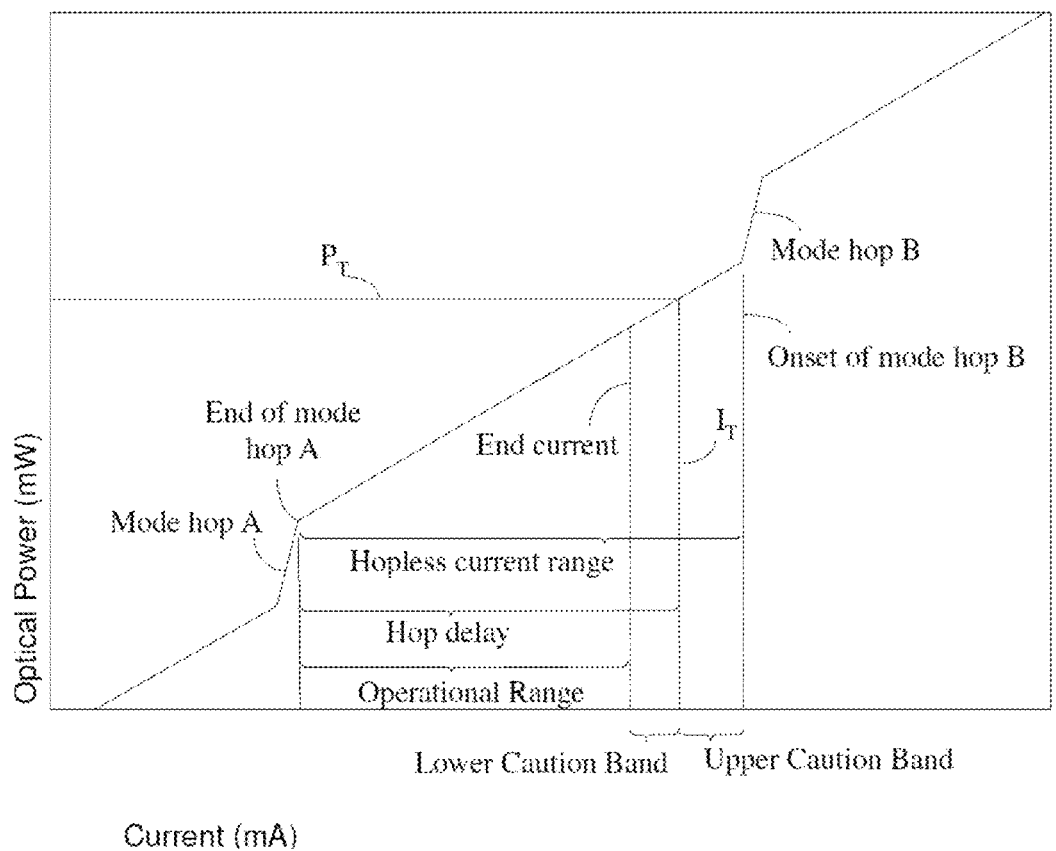
FIG. 2G illustrates the power versus current curve for the laser cavity of FIG. 2F after operation of the phase shifter.

Before and during the operation of the laser cavity, the phase shifter is used to shift the mode hops so as to increase the percentage of the "hopless current range" occupied by the "hop delay." In other words, the phase shifter increases the hop delay above the pre-shift hop delay. For instance, after burn-in, and before operation of the laser cavity, the phase shifter can be employed to shift the mode hops to lower current levels as illustrated in FIG. 2G. As is evident from FIG. 2G, the "hop delay" is now a much larger percentage of the "hopless current range" than it was when the "hop delay" was equal to the pre-shift hop delay. As a result, the laser can be operated for a longer period of time before the gain medium aging causes "mode hop A" to shift to the target current. In some instances, the phase shifter increases the hop delay to more than 105%, 125%, 160% or 200% of the pre-shift hop delay. In some instances, these shifts change the mode hop current levels such that the "hop delay" is more than 5%, 10%, 50%, or 75% of the "hopless current range." The shift can be a result of using the phase shifter to shift the mode hops by more than 10%, 50%, or 80% of the "hopless current range." This shifting can be done between the fabrication of the laser and the initial operation of the laser cavity, between burn-in of the laser and the initial operation of the laser cavity or can be done after the initial operation of the laser cavity. Since FIG. 2G illustrates the condition of the laser cavity after burn-in of the laser and before the initial operation of the laser cavity so as to output a light signal, the illustrated "hop delay" is the initial "hop delay." In some instances, the initial "hop delay" is more than 10%, 25%, or 50% and/or less than 20%, 40%, or 70%, of the "hopless current range."

When a phase shifter includes a temperature control device, the temperature control device is generally a localized temperature control device. For instance, the heater 26 of FIG. 1 is configured to influence only the temperature of the laser cavity. However, many optical devices are operated in conjunction with a de-localized temperature control device such as a thermoelectric coolers (TEC). De-localized temperature control device are generally used to heat and/or cool the entire device rather than a particular component on the device. For instance, devices that include light sources such as lasers are generally operated at temperatures above room temperature in order to prevent room conditions from affecting the performance of the various components on the device. The temperature at which a de-localized temperature control device maintains a device is the operating temperature of the device.

The initial hop delay is the hop delay after the de-localized temperature control device has been operated such that the device is at the operating temperature that is desired for the device. Accordingly, FIG. 2G can represent data after burn-in, after operation of the de-localized temperature control device so as to place the device at the desired operating temperature, and before operation of the laser cavity or after fabrication, after operation of the de-localized temperature control device so as to place the device at the desired operating temperature, and before operation of the laser cavity.

It is possible to use the phase shifter to shift the mode hop current levels until the target current level is at the current for the "onset of mode B" (labeled in FIG. 2G). However, in some instances, the mode hops are shifted such that the target current level is before the "onset of mode B" so as to leave an optional upper caution band (labeled in FIG. 2G). The upper caution band prevents "mode shift B" from occurring as a result of variations in the fabrication process and/or variations during operation of the laser. In some instances, the "upper caution band" is more than or equal to 20%, 10%, or 0% and/or less than or equal to 20%, 30%, or 40% of the "hopless current range." Accordingly, the phase shifter can be used to shift the power versus current curve such that the "hop delay" or "initial hop delay" is more than 10%, 30%, or 55% and/or less than 60%, 70%, or 80% of the "hopless current range."

Figure 2H:
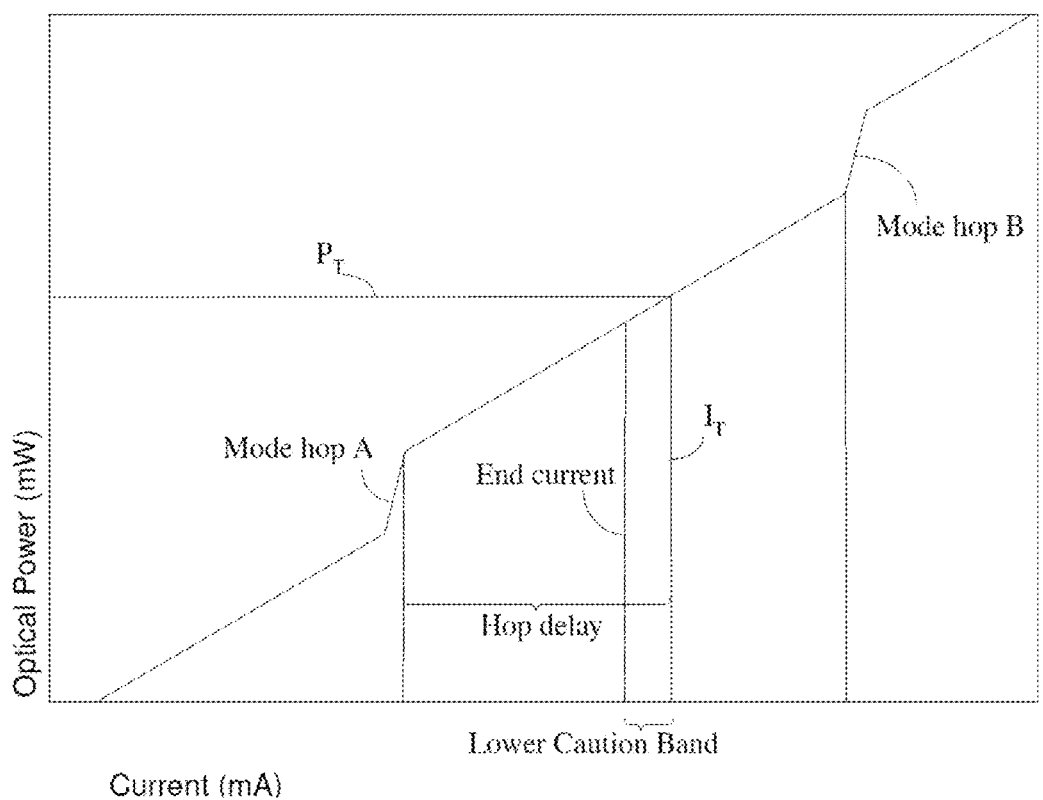
FIG. 2H illustrates the end of life power versus current curve for the laser cavity of FIG. 2G after shifting of the mode hops in response to aging of the laser cavity.

After the electronics have employed the phase shifter to shift the mode hops to the initial mode hop current levels, the laser can be operated. As noted above, over time, use of the gain medium causes the mode hops to shift to higher currents. FIG. 2H illustrates this shift during the operation of a laser with an initial operating condition shown in FIG. 2G. Despite the shift of the mode hops to higher current levels, the target power level remains the same or substantially the same; however, the hop delay has shortened as a result of "mode hop A" shifting toward the target current level. During operation of the laser, the electronics can operate the phase shifter so as to keep the effective length of the laser cavity constant or substantially constant. During operation of the laser cavity, the electronics can also hold the applied current level constant at the target current level or allow the applied current level to wander as is need to maintain the target power level. As a result, while the electronics operate the phase shifter so as to keep the effective cavity length of the laser at the same effective length or at substantially the same effective length, the electronics can also hold the current level applied to the laser constant at the target current level or allow the applied current level to wander as is need to maintain the target power level.

In some instances, operation of the laser is stopped once or before the operation of the laser causes the current level of mode hop A to shift to the target current level. For instance, FIG. 2G and FIG. 2H illustrate a "lower caution band" that extends from an "end current" (labeled in FIG. 2G and FIG. 2H) to the target current level. When use of the laser shifts the current level of mode hop A to the "end current" the use of the laser can be stopped. Since the level of the "end current" is below the target current level, the use of an "end current" can prevent "mode shift A" from inadvertently occurring as a result of variations in the fabrication process and/or variations during operation of the laser. In some instances, the "lower caution band" is more than or equal to 20%, 10%, or 0% and/or less than or equal to 30%, or 40% of the "hopless current range."

The "operational range" of the laser is the total range of current over which the current level of "mode hop A" shifts during the use of the laser cavity. As is evident from FIG. 2G, when caution bands are not used, the "operational range" is equal to the "hopless current range." When a lower caution band is used, the "operational range" extends from the current level of mode hop A as shown in FIG. 2G to the "end current." When a lower caution band is not used, the target current level serves as the "end current." Accordingly, in these instances, the "operational range" extends from the initial current level of "mode hop A" to the target current level. As is evident from FIG. 2G, the use of an upper caution band and/or lower caution band reduces "operational range" to a smaller range of values than the "hopless current range." In some instances, the phase shifter is used to shift the power versus current curve such that the "operational range" is more than 0%, 20%, or 40% and/or less than 50%, 75%, or 100% of the "hopless current range." During operation of the laser, the electronics can operate the one or more phase shifters so as to keep the effective length of the laser cavity constant or substantially constant while the mode hop A current level shifts by greater than or equal to 10%, 50%, or 100% of the "operational range" and/or by greater than or equal to 10%, 50%, or 100% of the initial "hop delay." For instance, when the phase shifter is a resistive heater, the electronics can operate the resistive heater such that the voltage across the resistive heater and/or the current through the resistive heater is the same or substantially the same while the mode hop A current level shifts by greater than or equal to 10%, 50%, or 100% of the "operational range" and/or by greater than or equal to 10%, 50%, or 100% of the initial "hop delay." During operation of the laser cavity, the electronics can also hold the applied current level constant at the target current level or allow the applied current level to wander as is need to maintain the target power level. For instance, while the electronics operate the phase shifter so as to keep the effective length of the laser cavity constant or substantially constant, the electronics can also hold the applied current level constant at the target current level or allow the applied current level to wander as is need to maintain the target power level.

As is evident from the above discussion, the system may need to identify when the "end of mode hop A" approaches or equals the "end current" or approaches or equals the target current level. The moment when "end of mode hop A" shifts to the target current level or the "end current" can be approximated using the mode hop shift rate. The mode hop shift rate indicates the amount of current that the mode hop shifts per unit time of laser operation. Accordingly, the total amount of laser operation time permitted by operating the laser cavity for the "operational range" (labeled in FIG. 2G) can be approximated by dividing the "operational range" by the mode hop shift rate. The result can serve as an operational time limit. The time that the laser is operated can then be tracked. When the laser has been operated for the operation time limit, the device can be disposed or the pending mode hop can be tolerated. Alternately, the phase shifter can once again be employed to shift the mode hops as discussed above. For instance, the phase shifter can increase the effective cavity length of the laser to a second effective cavity length that again shifts the mode hops so as to provide longer mode hop delays. This process can be repeated multiple times.

As noted above, in some instances, one or more mode hops can be tolerated. U.S. patent application Ser. No. 14/741,391, filed on Jun. 16, 2015, entitled "Resolution of Mode Hopping in Optical Links," and incorporated herein in its entirety discloses varying variables of the FIG. 1 device and optical links that include the FIG. 1 device so as to reduce errors resulting from mode hopping. These techniques can be combined with the phase shifter disclosed in this application to further reduce the effects of mode hopping.

The above method of operating the laser cavity does not require a feedback loop that adjusts device variables in response to the output of the laser. For instance, the laser cavity can exclude electronics that change operation of the phase shifter in response to the changes in the intensity and/or wavelength of the light signal output from the laser cavity. Accordingly, the above laser has a reduced level of complexity and costs while providing a stable output.

The laser cavity construction disclosed above is an example of an external cavity laser. An external cavity laser includes a passive region. For instance, the laser cavity guides the light through a medium other than the gain medium where light amplification does not occur at all or does not substantially occur. The region of the laser cavity where light is not amplified can serve as the passive region. As an example, the cavity waveguide 16 and gain waveguides 14 disclosed in the context of FIG. 1 are both included in the laser cavity but each guides the light through a different material. When the cavity waveguide 16 does not guide light through a gain medium, the passive region of the laser cavity can include, consist of, or consist essentially of the cavity waveguide 16. In contrast, lasers such as Distributed FeedBack (DFB) lasers have the partial return device defined in the gain medium. Accordingly, DFB laser cavities guide the light through a material(s) that is/are continuous along the length of the cavity. DFB lasers are generally not plagued with the same degree of mode hopping that is present in external cavity lasers. External cavity lasers are more affordable than DFB lasers and are accordingly more desirable; however, the issues with mode hopping have reduced their adoption into marketable optical systems. As a result, the introduction of phase shifters into external cavity waveguides can make a more affordable source of laser signals available to the marketplace.

Figure 3:
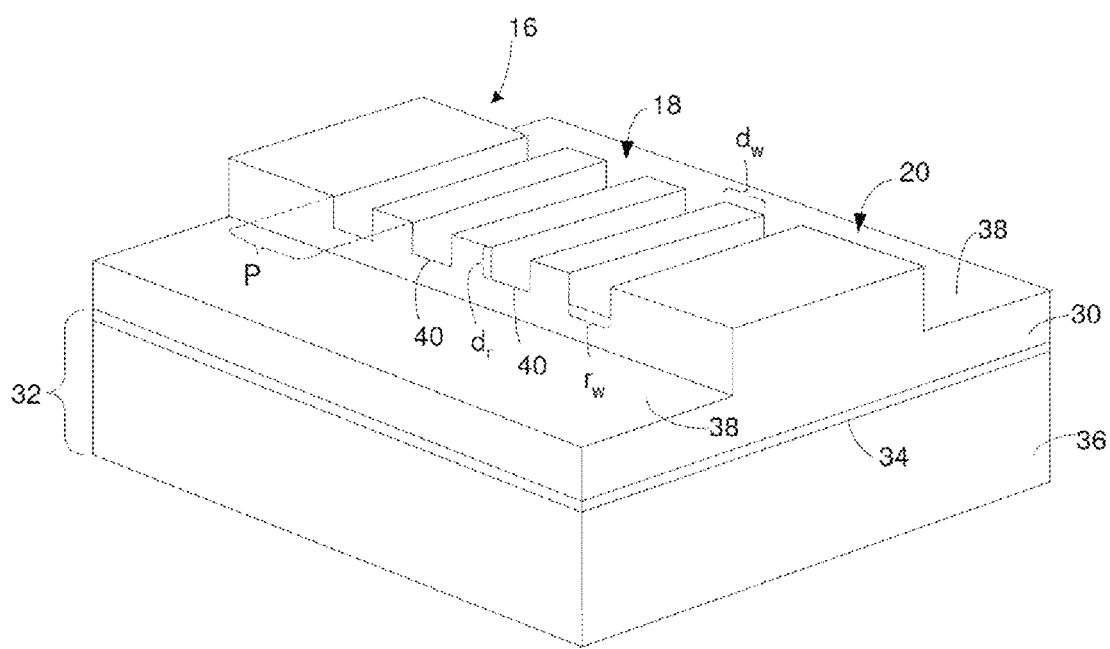
FIG. 3 shows a portion of a device constructed according to FIG. 1. The portion of the device shown in FIG. 3 includes a Bragg grating that serves as a partial reflection device. The Bragg grating includes recesses extending into a top of a ridge waveguide.

A suitable partial return device 18 is a reflective optical grating such as a Bragg grating. FIG. 3 shows a portion of a device constructed according to FIG. 1. The portion of the device shown in FIG. 3 includes a Bragg grating that serves as the partial reflection device. The device includes a light-transmitting medium 30 positioned on a base 32. The portion of the base 32 adjacent to the light-transmitting medium 30 is configured to reflect light signals from the light-transmitting medium 30 back into the light-transmitting medium 30 in order to constrain light signals in the light-transmitting medium 30. For instance, the portion of the base 32 adjacent to the light-transmitting medium 30 can be an optical insulator 34 with a lower index of refraction than the light-transmitting medium 30. The drop in the index of refraction can cause reflection of a light signal from the light-transmitting medium 30 back into the light-transmitting medium 30. Suitable light-transmitting media include, but are not limited to, silicon, polymers, silica, SiN, GaAs, InP and $LiNbO_3$.

The base 32 can include the optical insulator 34 positioned on a substrate 36. As will become evident below, the substrate 36 can be configured to transmit light signals. For instance, the substrate 36 can be constructed of a second light-transmitting medium 30 that is different from the light-transmitting medium 30 or the same as the light-transmitting medium 30. The illustrated device is constructed on a silicon-on-insulator wafer. A silicon-on-insulator wafer includes a silicon layer that serves as the light-transmitting medium 30. The silicon-on-insulator wafer also includes a layer of silica positioned on a silicon substrate 36. The layer of silica can serve as the optical insulator 34 and the silicon substrate 36 can serve as the substrate 36.

The illustrated portion of the device shows a Bragg grating at an interface between the cavity waveguide 16 and the output waveguide 20. A ridge of the light-transmitting medium 30 extends outward from slab regions 38 of the light-transmitting medium 30. The ridge partially defines each of the waveguides. For instance, the ridges and the base 32 together define a portion of a light signal-carrying region where light signals are constrained within each of the waveguides. When the device is constructed on a silicon-on-insulator wafer, the silica that serves as the insulator 34 has an index of refraction that is less than an index of refraction of the silicon light-transmitting medium 30. The reduced index of refraction prevents the light signals from entering the substrate 36 from the silicon. Different waveguides on the device can have different dimensions or the same dimensions.

Recesses 40 extend into the top of the ridge. The recesses 40 are filled with a medium having a lower index of refraction than the light-transmitting medium 30. The medium can be a solid or a gas such as air. Accordingly, the recesses 40 provide the variations in the index of refraction of the waveguide that allow the recesses 40 to act as a Bragg grating. The Bragg grating is illustrated with only four recesses 40 in order to simplify the illustration. However, the Bragg grating can include more than four recesses 40. In some instances, the recesses 40 are arranged so as to form a periodic pattern in the ridge. The period is labeled P in FIG. 3.

Figure 4A:
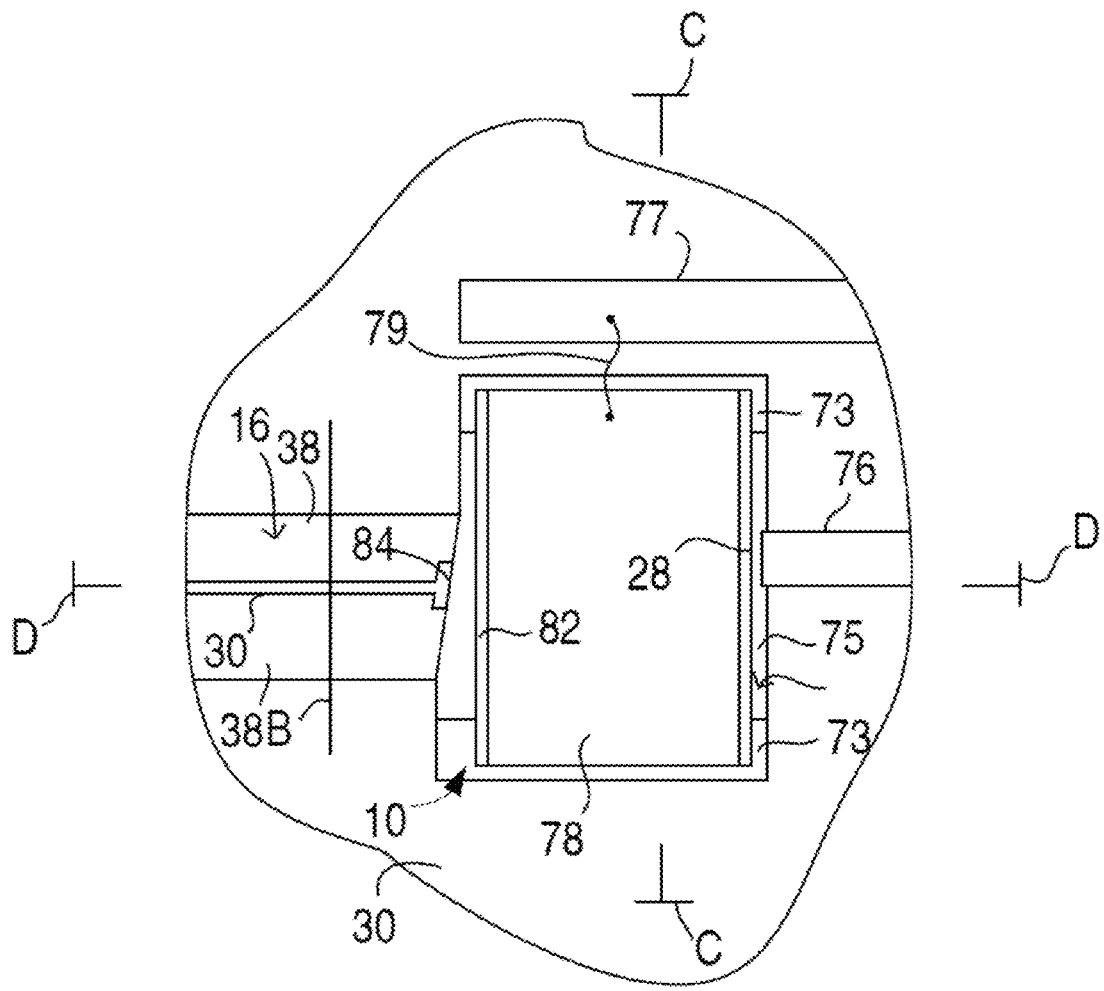
FIG. 4A through FIG. 4D illustrate the portion of a multi-channel device having an interface between a cavity waveguide and a gain element.
Figure 4B:
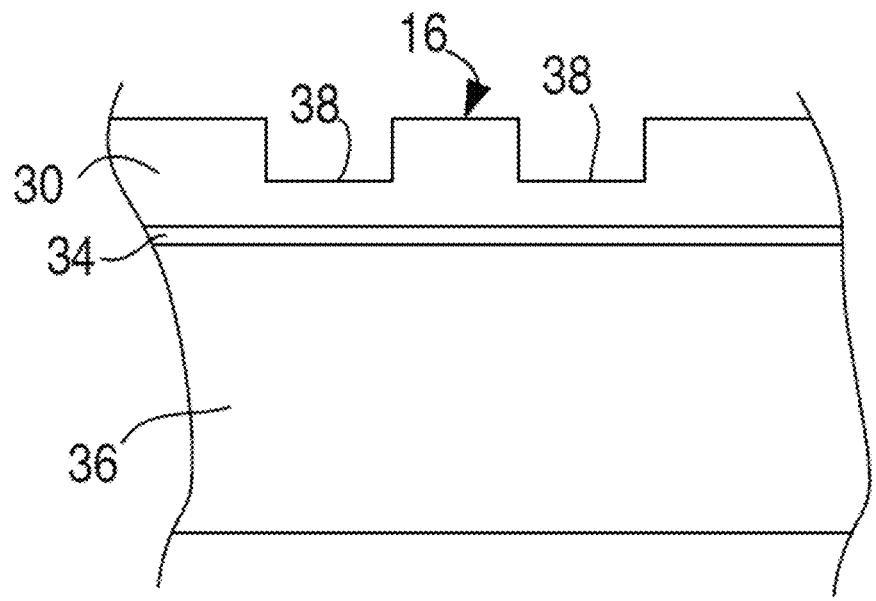
Figure 4C:
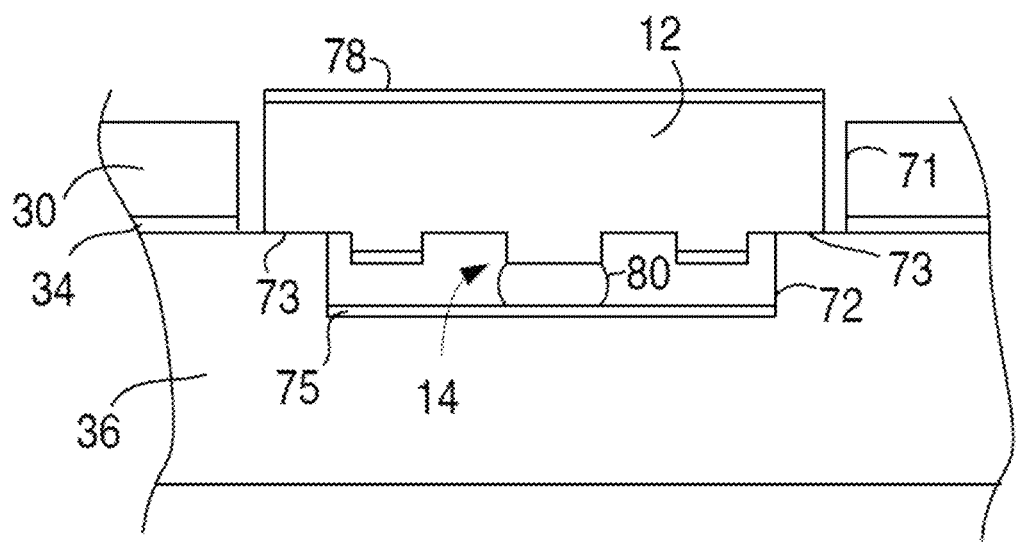
Figure 4D:
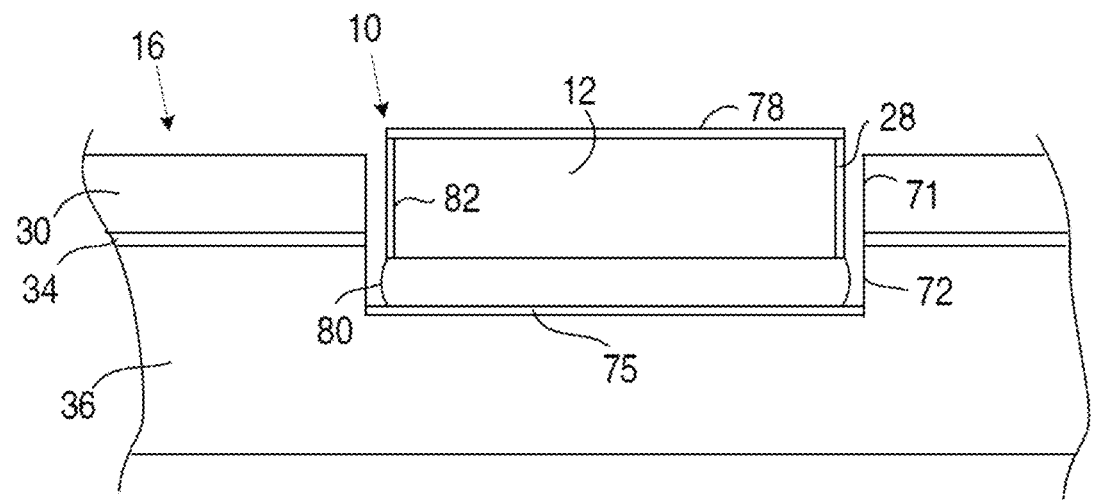

FIG. 4A through FIG. 4D illustrates a suitable structure for interfacing a gain element 10 with a cavity waveguide 16 as shown in FIG. 1. The device is constructed on a silicon-on-insulator wafer. FIG. 4A is a topview of the device. FIG. 4B is a cross section of the device shown in FIG. 4A taken along the line labeled B. The line labeled B extends through the cavity waveguide 16 disclosed in FIG. 1. Accordingly, FIG. 4B is a cross section of the cavity waveguide 16. FIG. 4C is a cross section of the multi-channel device shown in FIG. 4A taken along a line extending between the brackets labeled C in FIG. 4A. FIG. 4D is a cross section of the multi-channel device shown in FIG. 4A taken along a line extending between the brackets labeled D in FIG. 4A.

A first recess 71 extends through the silicon light-transmitting medium 30 and the silica insulator 34. A second recess 72 extends into the bottom of the first recess 71 such that the silicon substrate 36 forms shelves 73 in the bottom of the second recess 72. A first conducting layer 75 is positioned in the bottom of the second recess 72. A first conductor 76 on the silicon slab is in electrical communication with the first conducting layer 75. A second conductor 77 on the silicon slab is positioned adjacent to the first recess 71.

A gain element 10 is positioned in the first recess 71 and rests on the shelves 73. The gain element 10 includes a gain medium 12. A second conducting layer 78 is positioned on the gain medium 12. A third conductor 79 provides electrical communication between the second conducting layer 78 and the second conductor 77.

Three ridges extend into the second recess 72. The outer-most ridges have a passivation layer. The central ridge defines a portion of the gain waveguide 14 and is in electrical communication with the first conducting layer 75. The electrical communication between the central ridge and the first conducting layer 75 can be achieved through a conducting medium 80 such as solder. Since the first conductor 76 is in electrical communication with the first conducting layer 75, the first conductor 76 is in electrical communication with the central ridge.

The beam of light can be generated from the gain medium 12 by causing an electrical current to flow through the gain medium 12. The electrical current can be generated by applying a potential difference between the first conductor 76 and the second conductor 77. The potential difference can be provided by the electronics. The electronics can be included on the device or can be separate from the device but electrically coupled with the device.

The gain element 10 includes a reflecting surface on the gain medium 12. The reflecting surface can serve as the reflector 25 of FIG. 1. Suitable reflecting surfaces include a layer of metal on the layer of gain medium 12. The side of the gain medium 12 opposite the reflecting surface optionally includes an anti-reflective coating 82. The beam of light exits the gain medium 12 through the anti-reflective coating 82. Suitable anti-reflective coatings 82 include, but are not limited to, single-layer coatings such as silicon nitride or aluminum oxide, or multilayer coatings which may contain silicon nitride, aluminum oxide, and/or silica.

As is evident from FIG. 4A, the facet 84 for the cavity waveguide 16 can be angled at less than ninety degrees relative to the direction of propagation in the cavity waveguide 16. Angling the facet 84 at less than ninety degrees can cause light signals reflected at the facet 84 to be reflected out of the waveguide and can accordingly reduce issues associated with back reflection. Additionally or alternately, a facet of the gain waveguide can be angled at less than ninety degrees relative to the direction of propagation in the gain waveguide.

Suitable gain elements 10 include, but are not limited to, InP chips. The electrical communication between the second conducting layer 78 and the second conductor 77 can be achieved using traditional techniques such as wire bonding. The electrical communication between the central ridge and the first conductor 76 can be achieved through traditional techniques such as solder bonding.

Although FIG. 1 shows the gain element 10 positioned at an edge of the device, the gain element 10 can be located centrally on the device as shown in FIG. 4A through FIG. 4D.

Figure 5:
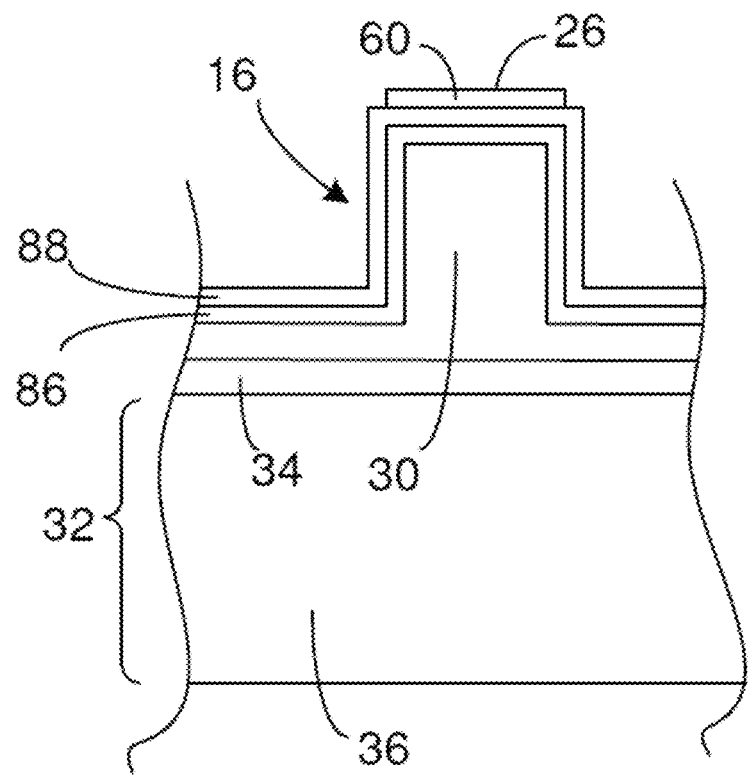
FIG. 5 is a cross section of a portion of an optical device having a heater on a waveguide.

FIG. 5 illustrates a suitable construction for the heater 26 of FIG. 1 on a silicon-on-insulator wafer. When the device of FIG. 1 is built on a silicon-on-insulator wafer, FIG. 5 can represent a cross section of the device taken along the line labeled A in FIG. 1. The device includes one or more claddings 86 and/or one or more material layer 88 located between the heater 26 and the cavity waveguide 16. In some instances, the one or more material layers 88 are electrically insulating. Examples heaters 26 include or consist of titanium traces, tungsten titanium traces, nichrome traces and TiN traces.

Examples of fabrication methods and constructions for a heater on the ridge of a waveguide are disclosed in U.S. patent application Ser. No. 14/231,383, filed on Mar. 31, 2014, and entitled "Temperature Control of Components on an Optical Device;" and in U.S. patent application Ser. No. 14/670,292, filed on Mar. 26, 2015, and entitled "Control of Thermal Energy in Optical Devices;" and in U.S. patent application Ser. No. 14/671,348, filed on Mar. 27, 2015, and entitled "Temperature Control of Components on an Optical Device;" each of which is incorporated herein in its entirety. The heater 26 of FIG. 1 and FIG. 5 can be structured, operated, and/or fabricated as disclosed in one or more of these applications or by other techniques employed in optical device fabrication.

EXAMPLE 1

A transmitter having a first laser cavity according to FIG. 1 and FIG. 4A was constructed on a silicon-on-insulator wafer. The laser cavity had a grating length of 800 um, a passive section length of 165 um, a recess depth (dr in FIG. 3) of 450 nm, grating period of 671.4 nm for 1550 nm wavelength, a gain medium length of 450 um. Burn-in of the laser cavity was performed at a temperature of 125 C, an applied current of 130 mA for 20 hours.

Figure 6A:
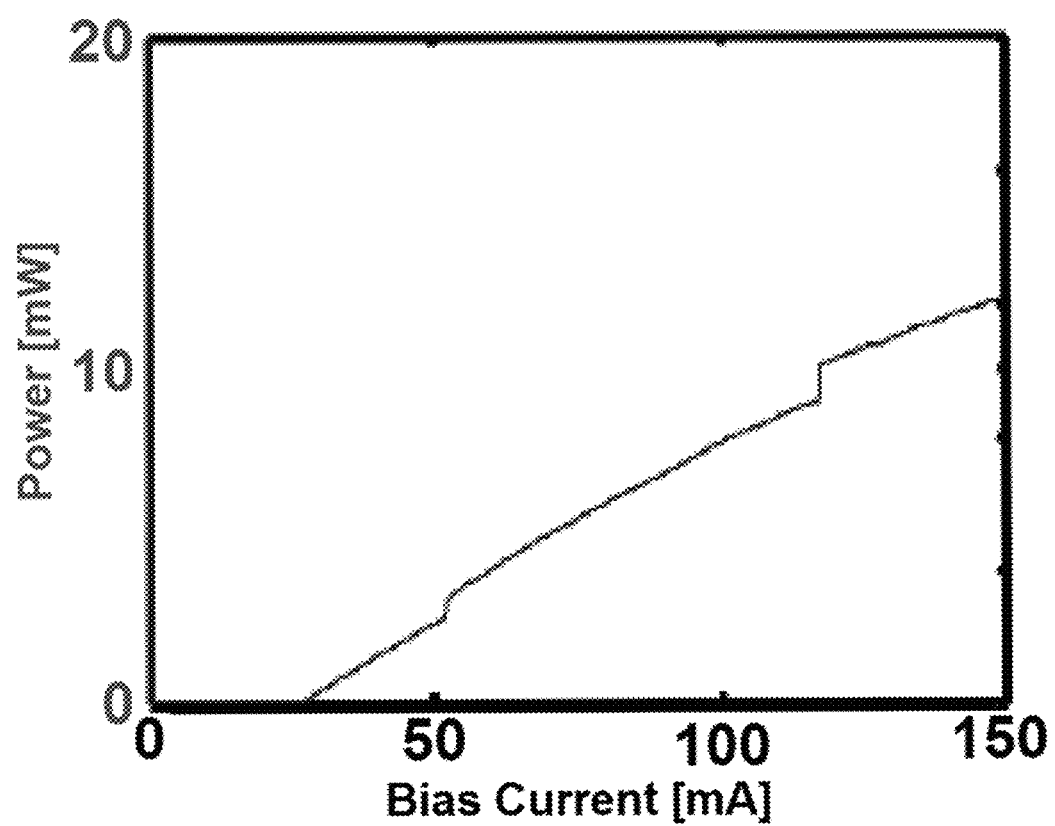
FIG. 6A is an experimental power versus current profile for a laser before burn-in, after burn-in and after 5.5 years of operation at 130 mA.
Figure 6B:
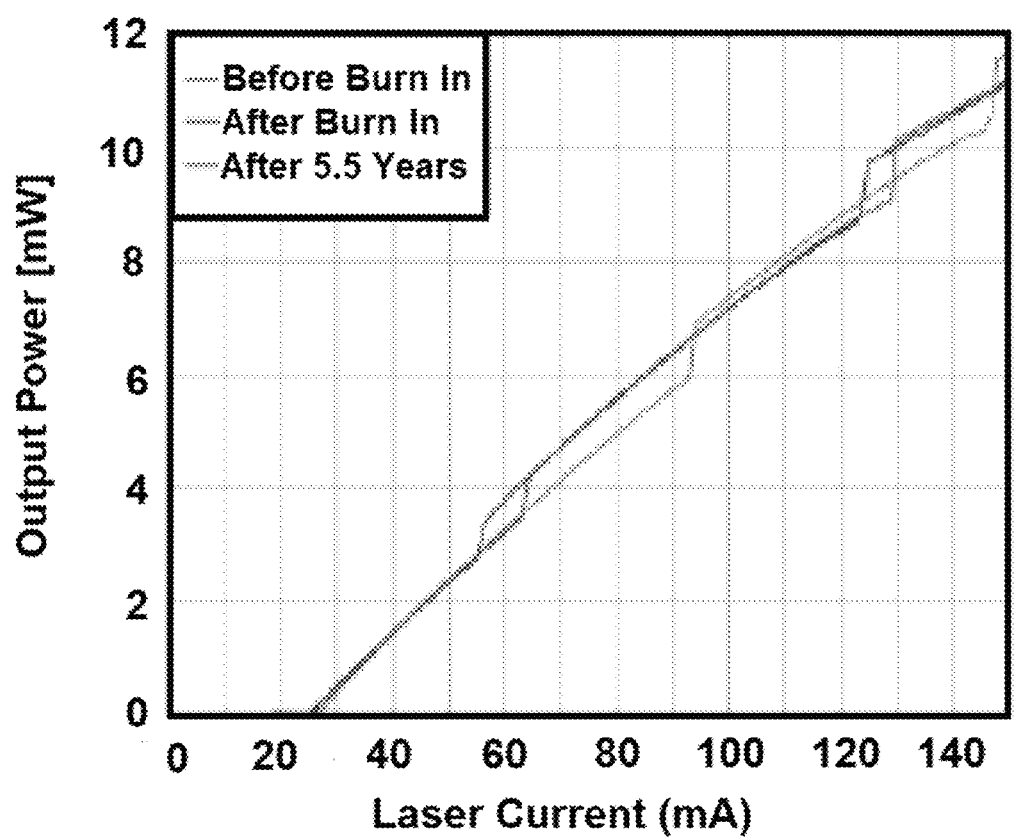
FIG. 6B through FIG. 6D illustrate the profile of the shift of two mode hop points due to aging.
Figure 6C:
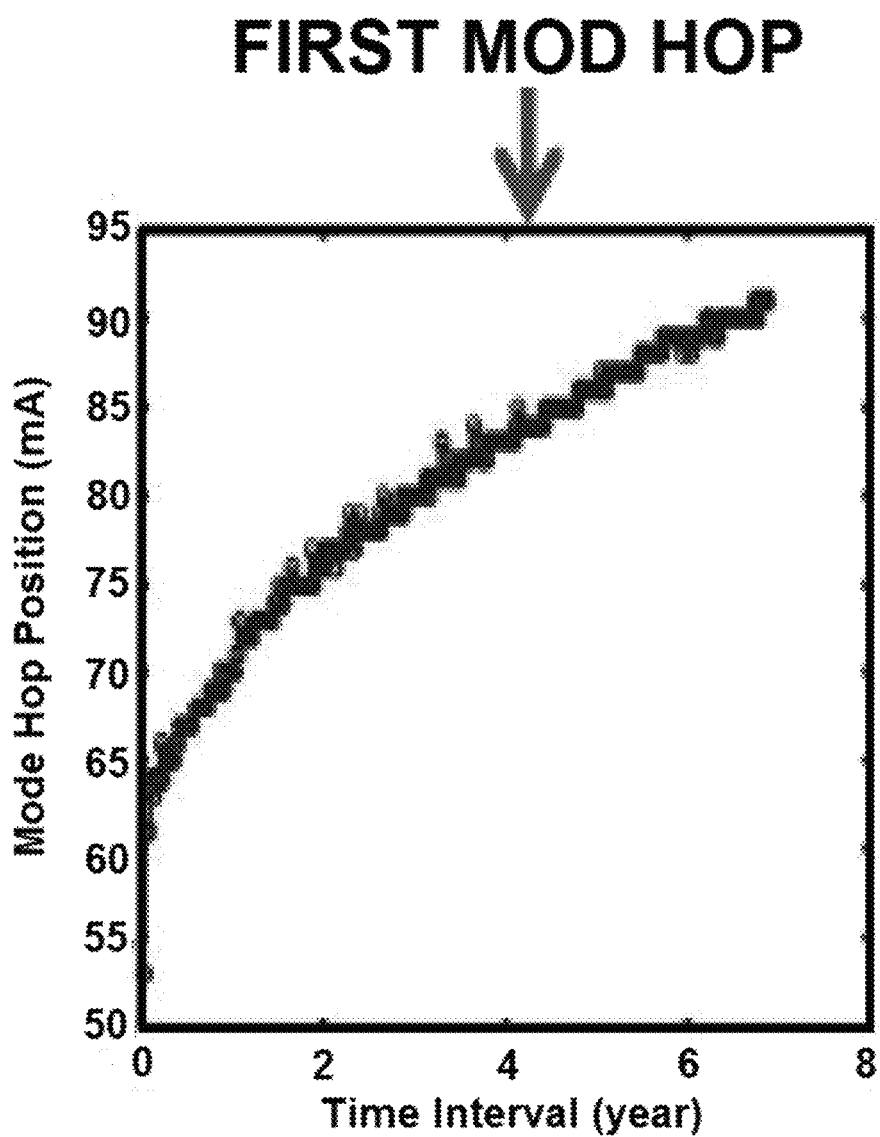
Figure 6D:
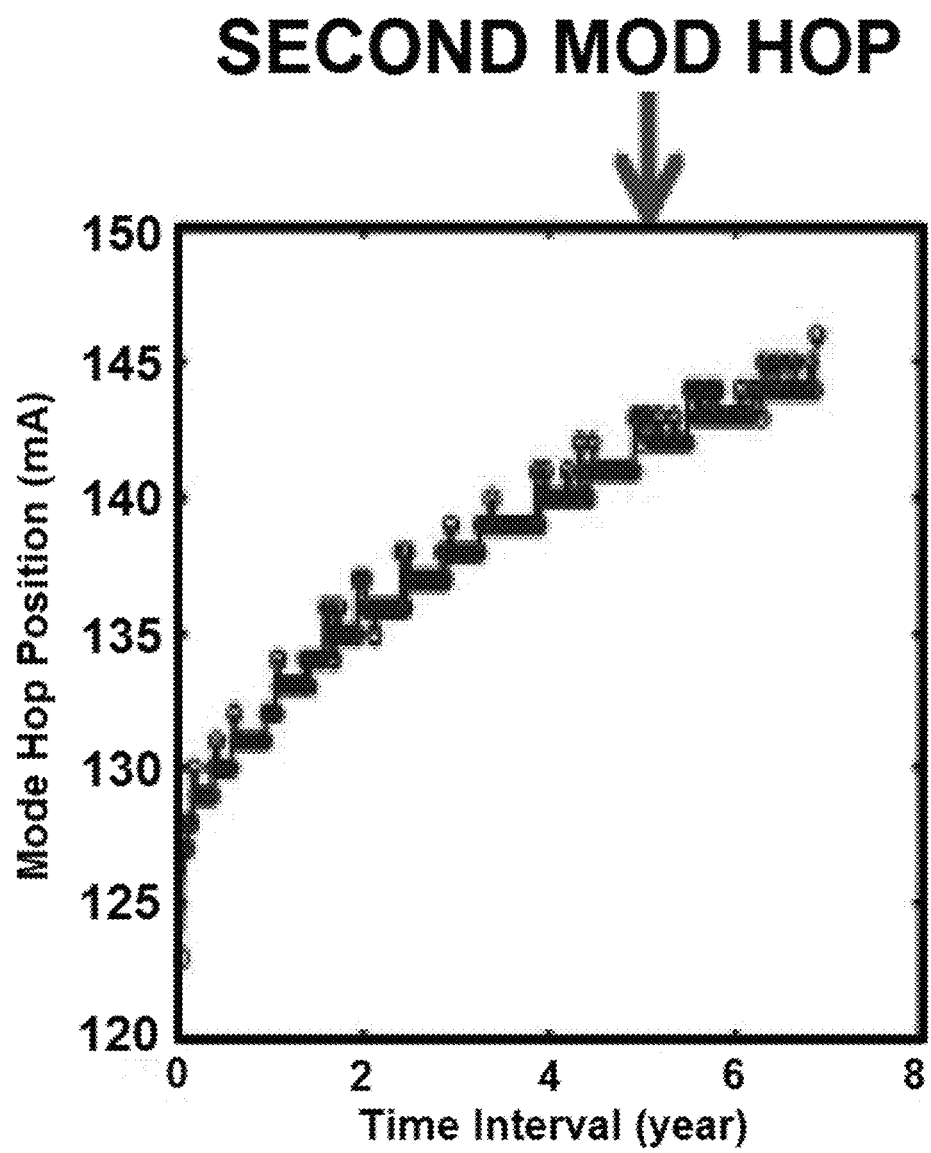

FIG. 6A presents the power versus current profile for the first laser after burn-in, before initial operation of the laser, after using a TEC to increase the temperature of the device to 25 C, and before use of the heater to shift the mode hops. Subsequent operation of the laser cavity at a target current of 130 mA provides a mode hop shift rate as illustrated by FIG. 6B through FIG. 6D.

Although the phase shifter is disclosed in the context of a resistive heater, other types of temperature control devices can be employed as phase shifters. For instance, components that use light, inductive heating, inductive cool or other energy to change the average temperature of the laser cavity can be employed as phase shifters. Further, the phase shifters can use mechanisms other than heat and/or cooling to achieve the desired phase shift. For instance, the phase shifters can employ stress to achieve the desired index change and subsequently phase shift.

Although the phase shifter is disclosed in the context of a resistive heater, other types of temperature control devices can be employed as phase shifters. For instance, components that use light, inductive heating, inductive cool or other energy to change the average temperature of the laser cavity can be employed as phase shifters. Further, the phase shifters can use mechanisms other than heat and/or cooling to achieve the desired phase shift. For instance, the phase shifters can employ stress to achieve the desired change in the average index of refraction of the laser cavity and accordingly the desired phase shift.

The above disclosure describes a variety of functions that are performed by electronics. Different functions of the electronics can be performed by subsets of the electronics that are physically and/or electrically distinct from one another or are integrated with one another. For instance, the electronics can include first electronics that apply the electrical current to the laser cavity and second electronics that operate the phase shifter as described. The first electronics can be the same as the second electronics or these can be physically distinct entities.

Suitable electronics for performing the above functions can include a controller. A suitable controller includes, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the electronics. A general-purpose processor may be a microprocessor, but in the alternative, the controller may include or consist of any conventional processor, microcontroller, or state machine. A controller may also be implemented as a combination of computing devices, e.g., a combination of a DSP and a microprocessor, a plurality of microprocessors, one or more microprocessors in conjunction with a DSP core, or any other such configuration.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical system, comprising:
a laser cavity on a base, the laser cavity generating a light signal in response to application of an electrical current to the laser cavity,
first electronics that apply a target level of the electrical current to the laser cavity so as to cause the laser cavity to generate the light signal,
the light signal experiencing mode hops at electrical current levels that shift to higher current levels in response to time of operation of laser cavity so as to generate the light signal, a first one of the mode hops occurring at a first current level and a second one of the mode hops occurring at a second current level, the second current level being higher than the first current level and there being no other mode hops that occur at a current level between the first current level and the second current level,
a phase shifter positioned on the base and interacting with the laser cavity so as to shift the mode hops to lower current levels; and
second electronics that operate the phase shifter such that the mode hops are shifted to electrical current levels where the target current level is between the first current level and the second current level, and a difference between the target level and the first current level is more than 5% of a difference between the second current level and the first current level.

2. The system of claim 1, wherein the phase shifter is a heater positioned on the base such that heat from the heater changes a temperature of at least a region of the laser cavity, the mode hops shifting to lower current levels in response to increasing the temperature of the laser cavity; and
the second electronics operate the heater.

3. The system of claim 2, wherein the laser cavity includes a gain medium through which the first electronics drive the target current, and
the laser cavity includes a cavity waveguide positioned to exchange light with the gain medium, the heater being positioned on the cavity waveguide such that that cavity waveguide is between the heater and the base.

4. The system of claim 2, wherein the second electronics hold the temperature of at least a portion of the laser cavity at a constant level during the generation of the light signal.

5. The system of claim 1, wherein the phase shifter tunes an effective length of the laser cavity and the second electronics operate the phase shifter so as to hold the effective length of the laser cavity at a constant level while the first mode hop shifts more than 10% of the difference between the second current level and the first current level.

6. The system of claim 1, wherein the first electronics applies the target level of the electrical current to the laser cavity while the first mode hop is shifting the more than 10% of the difference between the second current level and the first current level.

7. The system of claim 1, wherein the phase shifter tunes an effective length of the laser cavity and the second electronics operate the phase shifter so as to hold the effective length of the laser cavity at a constant level while the first mode hop shifts more than 30% of the difference between the second current level and the first current level.

8. The system of claim 7, wherein the first electronics applies the target level of the electrical current to the laser cavity while the first mode hop is shifting the more than 30% of the difference between the second current level and the first current level.

9. The system of claim 1, wherein the difference between the target level and the first current level is more than 30% of a difference between the second current level and the first current level.

10. The system of claim 1, wherein the difference between the target level and the first current level is less than 60% of a difference between the second current level and the first current level.

11. The system of claim 1, wherein the laser cavity is an external cavity laser.

12. The system of claim 1, wherein the system excludes electronics that operate the phase shifter in response to one or more characteristics selected from the group consisting of power of the light signal and wavelength of the light signal.

13. The system of claim 1, wherein the second electronics that operate the phase shifter such that the difference between the target level and the first current level is more than 110% of a difference between the target level and the first current level when the phase shifter is not operated.

14. An optical system, comprising:
a laser cavity on a base, the laser cavity generating a light signal in response to application of an electrical current to the laser cavity,
first electronics that apply a target level of the electrical current to the laser cavity so as to cause the laser cavity to generate the light signal,
the light signal experiencing mode hops at electrical current levels that shift to higher current levels in response to time of operation of laser cavity so as to generate the light signal, a first one of the mode hops occurring at a first current level and a second one of the mode hops occurring at a second current level, the second current level being higher than the first current level,
a phase shifter positioned on the base and interacting with the laser cavity so as to shift the mode hops to lower current levels; and
second electronics that operate the phase shifter such that the mode hops are shifted to electrical current levels where the target current level is between the first current level and the second current level, and a difference between the target level and the first current level is more than 1 mA.

15. A method of operating an optical system, comprising:
obtaining a laser cavity that generates a light signal in response to application of an electrical current to the laser cavity,
applying a target level of the electrical current to the laser cavity so as to cause the laser cavity to generate the light signal,
the light signal experiencing mode hops at electrical current levels that shift to higher current levels in response to time of operation of laser cavity so as to generate the light signal, a first one of the mode hops occurring at a first current level and a second one of the mode hops occurring at a second current level, the second current level being higher than the first current level,
shifting the mode hops to electrical current levels where the target current level is between the first current level and the second current level, and a difference between the target level and the first current level is more than 5% of a difference between the second current level and the first current level, and
shifting the mode hops includes heating the laser cavity so as to shift the mode hops.

16. The method of claim 15, wherein the difference between the target level and the first current level is more than 30% of the difference between the second current level and the first current level.

17. The method of claim 15, wherein the difference between the second current level and the first current level is more than 20 mA.

18. The method of claim 15, wherein the laser cavity is an external cavity laser.

19. The method of claim 15, wherein the system excludes electronics that operate a phase shifter in response to one or more characteristics selected from the group consisting of power of the light signal and wavelength of the light signal.

* * * * *